United States Patent [19]
Hsia et al.

[11] Patent Number: 5,903,180
[45] Date of Patent: May 11, 1999

[54] VOLTAGE TOLERANT BUS HOLD LATCH

[75] Inventors: Yuwen Hsia, Saratoga; Sarathy Sribhashyam, Sunnyvale, both of Calif.

[73] Assignee: S3 Incorporated, Santa Clara, Calif.

[21] Appl. No.: 08/900,084

[22] Filed: Jul. 24, 1997

[51] Int. Cl.$^6$ .................................................. H03L 5/00
[52] U.S. Cl. .......................... 327/333; 327/201; 327/199; 326/63
[58] Field of Search ................................... 327/208, 333, 327/200, 201, 199; 326/63

[56] References Cited

U.S. PATENT DOCUMENTS

| | | | |
|---|---|---|---|
| 4,963,766 | 10/1990 | Lundberg | 326/58 |
| 5,436,585 | 7/1995 | DiMarco | 327/333 |
| 5,736,887 | 4/1998 | Spence | 327/333 |

*Primary Examiner*—Timothy P. Callahan
*Assistant Examiner*—April Giles
*Attorney, Agent, or Firm*—Fenwick & West LLP

[57] ABSTRACT

A voltage tolerant bus hold latch comprises a first buffer transistor, a sense transistor, a low voltage latch, a node voltage controller and a pull-up circuit. The low voltage latch is coupled to the input by the first transistor. The node voltage controller is coupled to the input by the sense transistor. The node voltage controller has a pair of additional inputs coupled to the output of the low voltage latch. The output of the node voltage controller is coupled to control the operation of the pull-up circuit. The pull-up circuit is coupled to the supply voltage for the lower voltage circuitry, and has another control input coupled to the output of the low voltage latch. The output of the pull-up circuit is coupled to the input of the voltage tolerant latch. The pull-up circuit is selectively activated to pull the input of the latch to a high voltage level. The node voltage controller acts as voltage divider to maintain a voltage difference across the gate-to-drain of the pull-up circuit within the operating tolerance of the pull-up circuit ($Vtp+2*Vtn$).

32 Claims, 5 Drawing Sheets

VOLTAGE TOLERANT BUS HOLD LATCH

BACKGROUND OF THE INVENTION

1. Field of the Invention

The present invention relates generally to and transistors and circuits made using transistors. In particular, the present invention relates to a latch formed using metal-oxide-semiconductor field-effect transistors (MOSFETs). Still more particularly, the present invention relates to a bus hold latch that can be coupled to and between circuits having a higher operating voltage without affecting the performance of the latch.

2. Description of the Background Art

In the area of semiconductors, there is a continuing need for integrated circuits that have more transistors, thereby allowing more complicated and elaborate circuitry to be created on a single chip and enabling the chip to provide even greater functionality and computational power than is presently available. There is also a need to have integrated circuits consume less power since the number of transistors included within an integrated circuit is ever increasing. Furthermore, there is a need for increased switching speeds for the transistors since the operational clock speeds of integrated circuits are also ever increasing. These competing needs have caused the generation of mixed voltage integrated circuits where different portions of the circuits have different operating voltages and are created with different processes. For example, present day integrated circuits include mixed voltage scenarios having higher voltage portions operating at five (5) volts and created with a five volt (5V) process, and lower voltage portions operating at 3.3 volts and created with a three volt (3V) process.

One problem with such mixed voltage integrated circuits is connecting portions of the circuit having different operating voltages. The differential in operating voltages causes device failure and inaccurate operation in the transistors connecting ("connecting transistors") the lower voltage portions to the higher voltage portions because of the increased voltage stress placed on the connecting transistors designed for operation at the lower voltage. Typically, the semiconductor fabrication process used to create the lower voltage portions, for example a 3V process, creates devices using thinner layers of semiconductor materials than those used in the fabrication process to create the higher voltage portions of the integrated circuit. In particular, the wells of the transistors are more shallow and the gate oxide thickness are reduced, thus less material is required to manufacture such integrated circuits. The process migration has been driven by the desire for improved performance with circuits that consume less power and have greater switching speeds. The difference in thickness used in these processes affects the leakage current of transistors and in turn the overall reliability of mixed voltage circuits. A 5V voltage difference between gate-drain, gate-source or source-drain can cause sufficient degradation in the performance of the transistors, especially in 3V process transistors.

One prior art approach used to reduce the instances of device failure for connecting transistors has been to increase the thickness of some of the low operating voltage portions of the integrated circuit, specifically the connecting transistors. For example, the prior art has used a "dual oxide" for core areas where the lower operating voltage portions of the integrated circuit interface with the higher operating voltage portions of the integrated circuit. Use of "dual oxide" especially for the gate oxide reduces the reliability problems of the connecting transistors, however, the use of dual oxide creates other problems. In particular, the use of dual oxide makes the manufacturing process more difficult by adding undesirable levels of complexity and cost. Furthermore, the use of dual oxide changes the threshold voltages of the transistors and also degrades the switching speed of the connecting transistors, and creates a bottleneck limiting the rate at which data can be transmitted from in and out of the integrated circuit.

Yet another prior art approach used to reduce the instances of device failure for connecting transistors is the use of a floating well as part of the connecting transistors. A transistor with a floating well is a MOSFET transistor having a well that switches between being coupled to a higher operating voltage (i.e., 5 volts) and a lower operating voltage (i.e., 3.3 volts). The switching between voltages is triggered by the charge and discharge of the well once the higher operating voltage is applied to and removed from the transistor. However, the problem with the use of floating wells is that its is difficult to predict the charging and discharging times for particular wells. Furthermore, the charging and discharging times are highly dependent on the layout pattern and operation of the circuit. Therefore, this prior art approach has not been used extensively because of these timing reliability issues.

One particular type of device commonly used in connecting mixed voltage circuits is a bus hold latch. Bus hold latches are provided to prevent a signal line from floating. When the signal line is floating and goes below a voltage $V_{OL}$, a bus hold latch pulls the line low and latches it to zero volts. Similarly, when the signal line is floating and goes above a voltage $V_{OH}$, a bus hold latch pulls the line high and latches it to 3.3 volts or the high voltage level for the operating voltage. Between the voltages of $V_{OH}$ and $V_{OL}$ it cannot be predicted whether the signal line will be latched to high or low only that it will be latched. This presents a number of problems because bus hold latches presently available operate properly only when the input voltage and supply voltage are the same. Thus, if a higher operating voltage level is applied to the input of a latch having a supply voltage the same as the lower operating voltage level, which is common for the lower operating voltage circuit portions, a number of problems will result. For example, the latch will short out when the higher operating voltage level is applied to the input. Furthermore, because of leakage current for the transistors in the lower operating voltage circuit portions, application of the higher operating voltage can cause device failure for these transistors.

Therefore, there is a continuing need for a latch that can be used in a mixed voltage circuit without the device failure of the prior art. Such a latch must be easy to manufacture and not suffer from switching speed delays.

SUMMARY OF THE INVENTION

The present invention overcomes the deficiencies and limitations of the prior art with a voltage tolerant latch that can be coupled between a higher operating voltage circuit and a lower operating voltage circuit. The preferred embodiment of the voltage tolerant latch advantageously eliminates the above-mentioned reliability problems, and does not require additional semiconductor processes for manufacture. The voltage tolerant latch advantageously uses design techniques to make the latch tolerant to higher operating voltages and is capable of operation at such higher voltages without device failure. A preferred embodiment of the voltage tolerant latch preferably comprises a first buffer transistor, a sense transistor, a low voltage latch, a node voltage controller and a pull-up circuit. The low voltage latch is coupled to an input signal line by the first buffer transistor. The output of the low voltage latch is coupled to the node voltage controller and the pull-up circuit. The node voltage controller is coupled to the input signal line by the sense transistor. The node voltage controller has a pair of additional inputs coupled to the low voltage latch and the pull-up circuit. The output of the node voltage controller is coupled to control the operation of the pull-up circuit. The pull-up circuit is coupled to the supply voltage for the lower voltage circuitry, and has a first control input coupled to the output of the low voltage latch, and a second control input coupled to the node voltage controller. The output of the pull-up circuit is coupled to the input signal line for the voltage tolerant latch. The pull-up circuit is selectively activated to pull the input signal line of the voltage tolerant latch to a high voltage level of the lower operating voltage. The node voltage controller acts as voltage divider to maintain a voltage difference across the gate-to-drain of the pull-up circuit that is within operating tolerance of the pull-up circuit. The node voltage controller controls the operation of pull-up circuit to prevent the latch from shorting and aids in the transition to the high output levels of both the lower operating voltage and the higher operating voltage. Because of the node voltage controller and the pull-up circuit, the voltage tolerant latch operates unaffected by the application of the higher operating supply voltage on the input signal line. The present invention also provides very low leakage currents to and from the input signal line.

DETAILED DESCRIPTION OF THE PREFERRED EMBODIMENTS

While the present invention will now be described in terms of a 3.3V bus hold latch made for operating at a lower operating voltage of 3.3V and constructed using 3V process technology such that it is tolerant of a higher operating voltage of a 5V supply voltage, those skilled in the art will realize that the present invention applies to other mixed voltage scenarios other than the particular mixed operating voltages of 3.3V and 5V.

Figure 1:
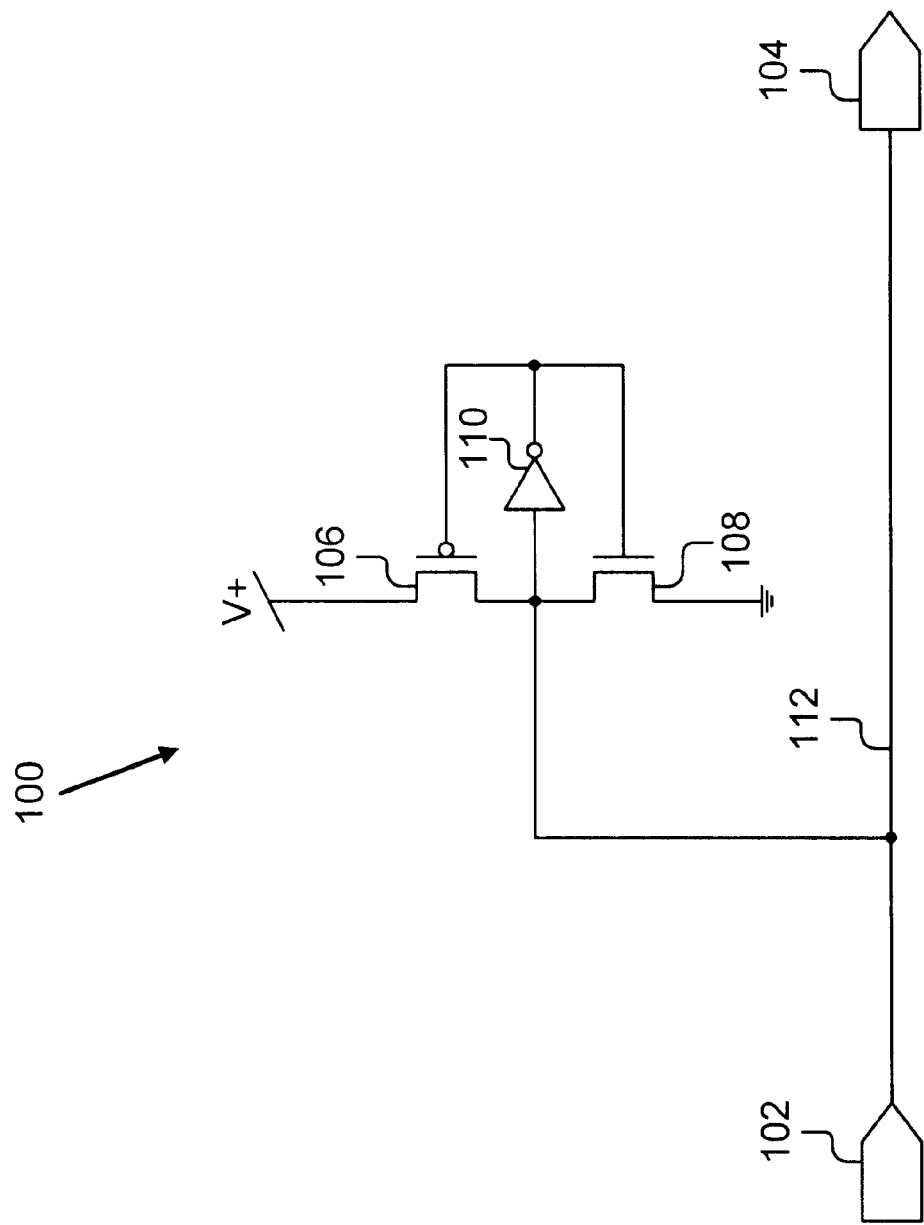
FIG. 1 is a block diagram of a prior art bus hold latch.

Referring now to FIG. 1, a block diagram of a prior art bus hold latch 100 is shown. The prior art latch 100 is shown coupled to a bus 112 extending between a first pad 102 and an second pad 104 for illustration purposes only. The prior art latch 100 comprises a pull-up transistor 106, a pull-down transistor 108 and an inverter 110. The prior art latch 100 is a semiconductor device that alternates between two states, outputting either a high signal (logical 1) or a low signal (logical 0), and pulling the line attached to the input of the latch 100 to the same state. The latch 100 acts to secure the bus line 112 at either a high or low signal state. For example, if a low signal is applied to the input of the prior art latch 100, the signal is inverted by inverter 110 to produce a high signal that is applied to the gates of pull-up transistor 106 and the pull-down transistor 108. The pull-up transistor 106 is turned off and pull-down transistor 108 is turned on. Since the pull-down transistor 108 is turned on, this holds the input to the latch 100 at the low signal. Similarly, the output of the prior art latch 100 is also fed back to control the pull-up transistor 106, such that when the prior art latch 100 is outputting a low signal, the pull-up transistor 106 turns on and helps pull up the input to the prior art latch 100 to high. In this manner, the prior art latch 100 holds the input in a given state even after the activating signal is no longer asserted. In order to change the state of the prior art latch 100, a signal the same as the output value of the inverter 110 must be input to the latch 100 to cause the latch 100 to change states and switch the states of the pull-up transistor 106 and pull-down transistor 108. Those skilled in the art will immediately recognize that the prior art latch 100 is constructed using CMOS technology.

Figure 2:
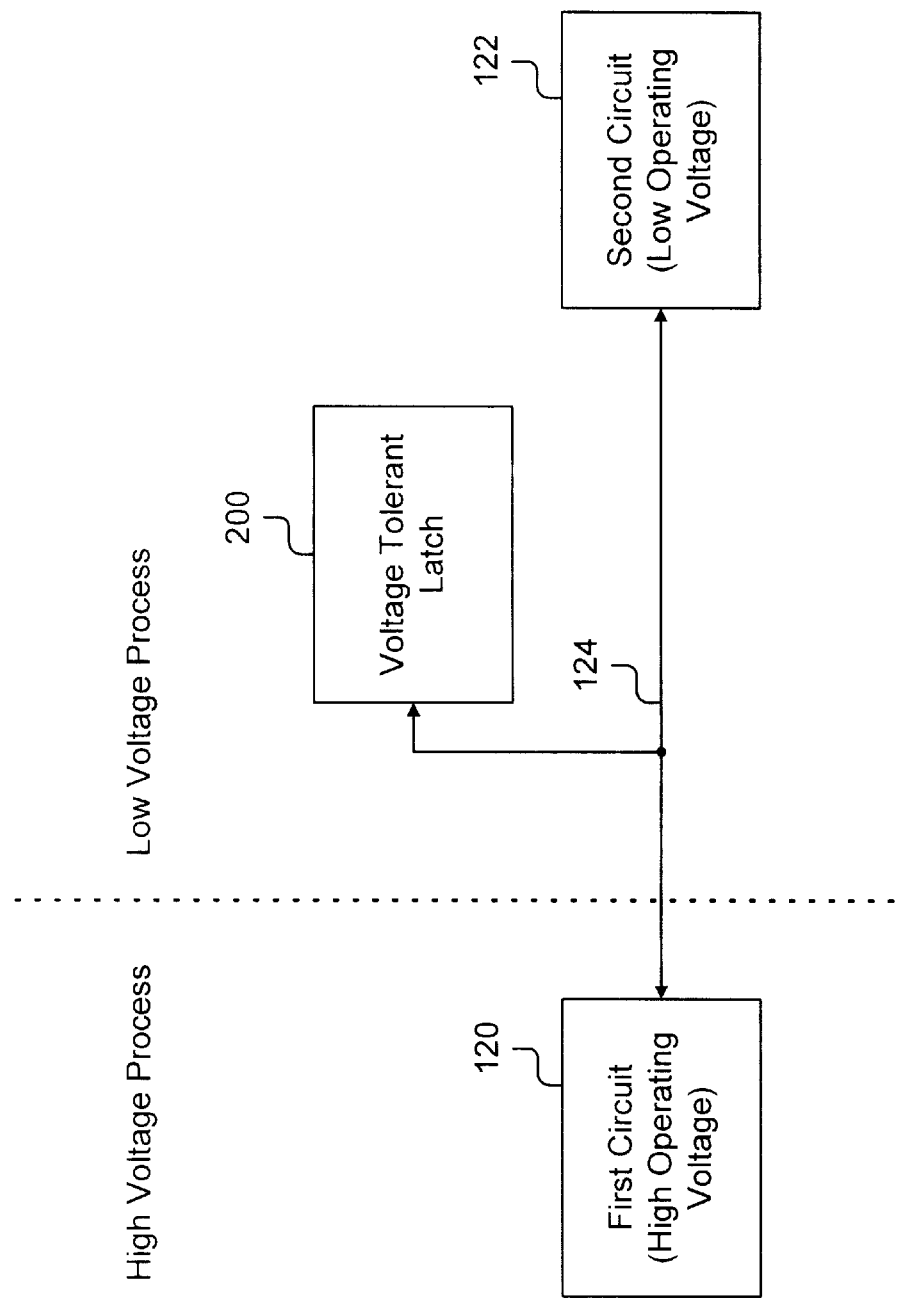
FIG. 2 is a diagram of a voltage tolerant bus hold latch of the present invention shown coupled between a first circuit having a first operating voltage, and a second circuit having a second operating voltage, the first operating voltage being higher than the second operating voltage.

Referring now to FIG. 2, a block diagram of a preferred embodiment of the voltage tolerant latch 200 of the present invention is shown. The voltage tolerant latch 200 is designed for use in mixed voltage circuits, and is shown coupled to a signal line 124 connecting a first circuit 120 having a higher operating voltage and a second circuit 122 having a lower operating voltage. The voltage tolerant latch 200 is most advantageous in this situation for holding the signal line 124 in either a high state or a low state, and preventing the signal line 124 from floating. The first or higher voltage circuit 120 is preferably circuitry such as a plurality of transistors, discrete devices and interconnections (not shown) having a first operating voltage, for example 5 volts. The higher voltage circuit 120 is connected to an input of the voltage tolerant latch 200 by signal line 124. The second or lower voltage circuit 122 is also coupled to signal line 124. The lower voltage circuit 122 is preferably circuitry such as a plurality of transistors, discrete devices and interconnections (not shown), however, the lower voltage circuit 122 has a second lower operating voltage, for example 3.3 volts.

The voltage tolerant latch 200 has the same functionality as in the prior art in that it is a semiconductor device that alternates between two states, holding the signal line 124 to either a high signal (logical 1) or a low signal (logical 0). The primary function of the voltage tolerant latch 200 is to drive or hold the signal line 124 into either state, and prevent the signal line 124 from floating. However, unlike the prior art, the voltage tolerant latch 200 operates properly and without affecting the performance of the voltage tolerant latch 200 when a high signal (i.e., 5V) at the higher operating voltage is applied to the signal line 124, and thus, the input of the voltage tolerant latch 200. More specifically, in the mixed voltage context where a logical 1 signal is 3.3V for the lower operating voltage and a logical 1 signal is 5V for the higher operating voltage, the voltage tolerant latch 200 operation and performance is unaffected by application of a logical 1 level of the higher operating voltage or 5V high signal to its input. While the signal line 124 will remain at 5V high signal level as long as the 5V or logical 1 level of the higher operating voltage is applied, once the logical 1 level of the higher operating voltage is removed, the voltage tolerant latch 200 will continue to latch or hold the signal line 124 at logical 1 level of the lower operating voltage (e.g., 3.3V). If a logical 1 of the lower operating voltage is applied, the voltage tolerant latch 200 operates in a conventional manner latching to the logical 1 level of the lower operating voltage until a logical 0 signal is applied to the signal line 124. In a like manner when a logical 0 at either the lower operating voltage or the higher operating voltage (0V in both cases), the voltage tolerant latch 200 hold the signal line 124 at 0V. Therefore, the present invention is particularly advantageous over the prior art since it operates properly when either the 3.3V or 5V high signal is applied to the input, and can be used in places where the prior art latch 100 could not because of shorting problems, device failure, and excessive leakage current.

Figure 3:
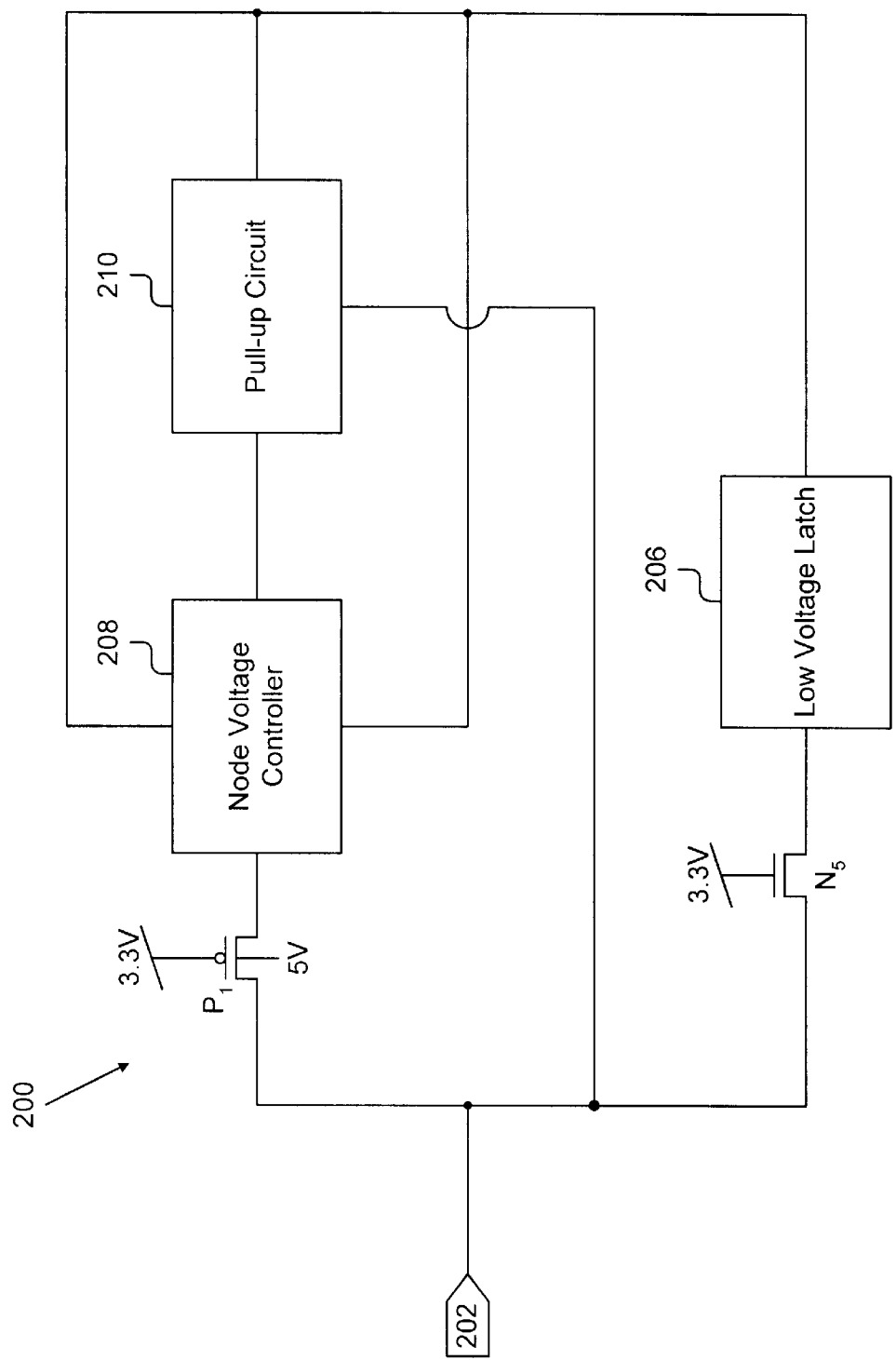
FIG. 3 is a block diagram of a preferred embodiment of the voltage tolerant latch constructed according to the present invention.

Referring now to FIG. 3, preferred embodiment of voltage tolerant latch 200 is shown. The voltage tolerant latch 200 has an input 202 that can be coupled to receive input signals from either other lower voltage circuitry or higher voltage circuitry (as shown in FIG. 2). The input 202 is preferably coupled to a signal line such as signal line 124. The voltage tolerant latch 200 preferably comprises a first buffer transistor $N_5$, a sense transistor $P_1$, a low voltage latch 206, a node voltage controller 208 and a pull-up circuit 210. The first buffer transistor $N_5$ is preferably a NMOS transistor and has its drain coupled to and forming the input 202 of the voltage tolerant latch 200, its source coupled to an input of the low voltage latch 206, and its gate coupled the supply voltage of the lower voltage circuit (3.3V). The sense transistor $P_1$ is preferably a PMOS transistor and has its drain coupled to the input 202 of the voltage tolerant latch 200, its source coupled to an input of the node voltage controller 208, and its gate coupled the supply voltage of the lower voltage circuit (3.3V). It should be noted that the sense transistor $P_1$ also has its well coupled to the supply voltage of the higher voltage circuit (5V). This coupling of the well helps prevent device failure for the sense transistor $P_1$. The first buffer transistor $N_5$ is advantageously used to buffer and protect low voltage latch 206 from application of high (5V) at the higher operating voltage level on the input 202 of the voltage tolerant latch 200.

The low voltage latch 206 is coupled to the input 202 via the first buffer transistor $N_5$. The output of the low voltage latch 206 is coupled to the pull-up circuit 210 and the node voltage controller 208. The low voltage latch 206 is similar to the prior art latch 100 described above with reference to FIG. 1. The low voltage latch 206 is provided with a supply and other operating voltages the same as the lower voltage circuit 122 (e.g., 3.3V). Therefore, the level at which the input 202 is held by the voltage tolerant latch 200 will be 0V for low, and 3.3V for high for the context in which the present invention is being described. Nonetheless, if the input 202 is driven to the 5V level, the latch 200 is effectively disabled without affecting its operation, and to prevent damage that application of 5V on the input 202 might otherwise cause. The voltage tolerant latch 200 is able to pull the input 202 to 3.3V by using the pull-up circuit 210 since the output of the low voltage latch 206 is at most the lower operating supply voltage minus the voltage drop across the first buffer transistor $N_5$ (3.3V–Vtn). Again, those skilled in the art will realize that low and high voltage values of 0V and 3.3V are only used by way of example, and that any other operating voltages could be used with the present invention.

The node voltage controller 208 has several inputs and an output. One of the inputs of the node voltage controller 208 is coupled to the input 202 by the sense transistor $P_1$. The node voltage controller 208 has a pair of additional inputs coupled to the output of the low voltage latch 206. The output of the node voltage controller 208 is coupled to control the operation of the pull-up circuit 210. The node voltage controller 208 is used to control the pull-up circuit 210 to assist in the charging of the input 202. The node voltage controller 208 also acts as a voltage divider in transitional states to protect other parts of the voltage tolerant latch 200 from device failure when the high or supply voltage of the higher voltage circuit (5V) is applied to the input 202.

The pull-up circuit 210 is preferably coupled to the supply voltage for the lower voltage circuitry (not shown in FIG. 3, 3.3V), and has a first control input coupled to the output of the low voltage latch 206, and a second control input coupled to output of the node voltage controller 208. The output of the pull-up circuit 210 is coupled to the input 202 of the voltage tolerant latch 200. The pull-up circuit 210 is selectively activated to pull the input 202 of the voltage tolerant latch 200 to a high voltage level (3.3V) for the lower operating voltage. As has been noted above, the low voltage latch 206 is able only to output a high signals of lower operating supply voltage minus the voltage drop across the first buffer transistor $N_5$ (3.3V–Vtn). Therefore, the pull-up circuit is activated in response to the output of the low voltage latch 206 and uses transistors to pull the input line 202 up to a 3.3V level. The node voltage controller 208 controls the operation of pull-up circuit 210 to prevent device failure and aids in the transition to low and high output levels. When the output of the low voltage latch 206 is low and the output of the node voltage controller 208 reaches a lower level (3.3V–2*Vtn), the pull up circuit is activated and helps bring the voltage level on the input 202 to high of the lower voltage circuitry (3.3V). When the output of the low voltage latch 206 is high (3.3V) and the output of the node voltage controller 208 will be low since it is controlled by the output of the low voltage latch 206; and the pull-up circuit 210 is inactive and does not affect the voltage level on the input 202. However, in such a case, the output of the node voltage controller 208 will be low and will slightly help pull the input 202 to low, but the input 202 is primarily maintained at low by the conventional latch 206 (through transistors $N_6$ and $N_5$).

Figure 4:
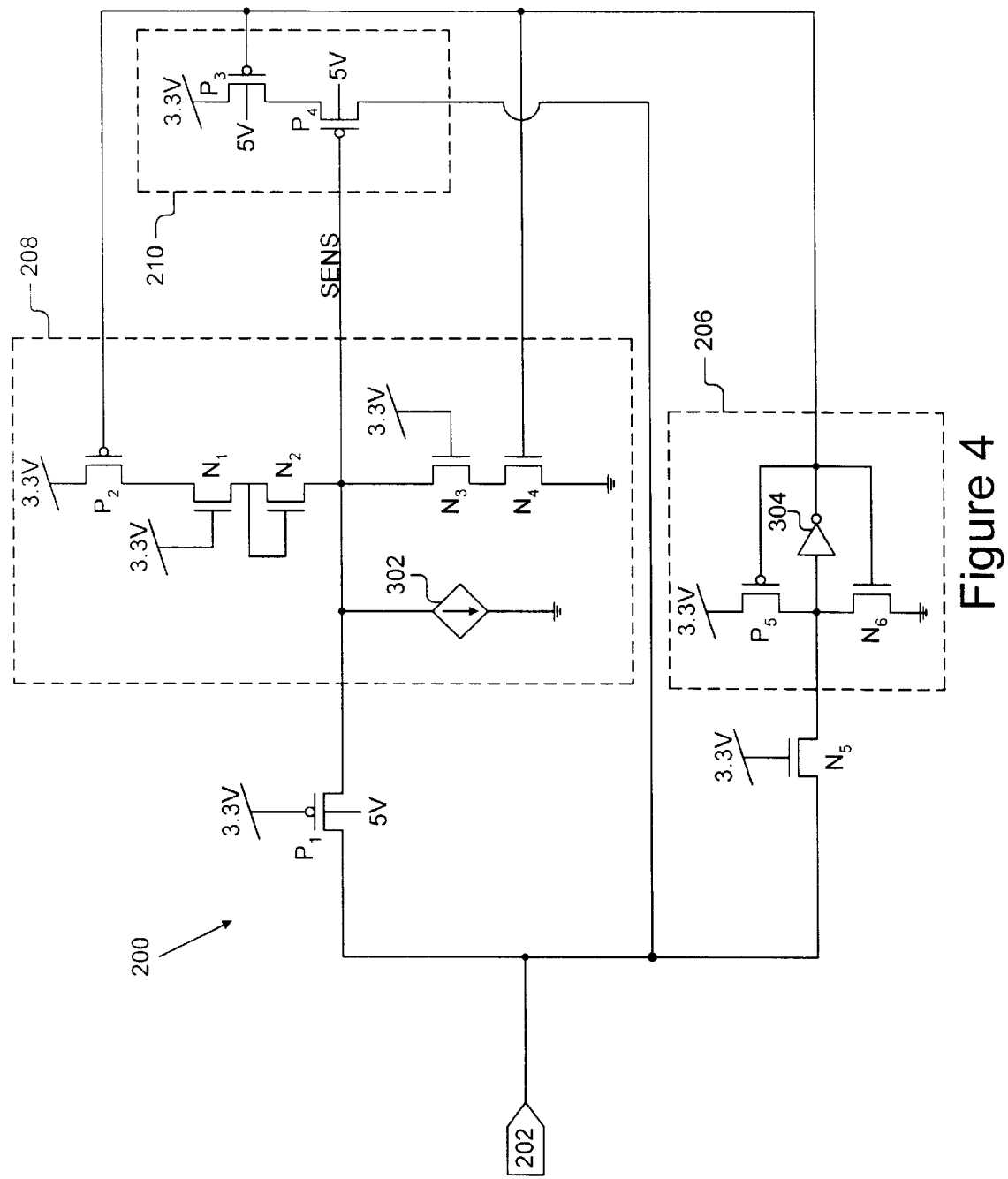
FIG. 4 is a detailed block diagram of the preferred embodiment of the voltage latch constructed according to the present invention.

Referring now to FIG. 4, the preferred embodiments for the low voltage latch 206, the node voltage controller 208, and the pull-up circuit 210 are shown in more detail. For convenience and ease of understanding, like reference numerals have been used for like parts where possible. Furthermore, the detailed embodiment of the low voltage latch 206, node voltage controller 208, and the pull-up circuit 210 are described below with the operating voltage of the lower voltage circuit 122 as 3.3V, and the operating voltage of the higher voltage circuit 120 as 5V. Nonetheless, those skilled in the art will realize how the present invention can be used in a variety of other mixed voltage scenarios.

As shown in FIG. 4, the lower voltage latch 206 will first be described. The lower voltage latch 206 preferably comprises a first transistor $P_5$, a second transistor $N_6$ and an inverter 304. The lower voltage latch 206 has standard functionality and alternates between two states, outputting either a high signal or a low signal. The input to the inverter 304 forms the input of the lower voltage latch 206 and is coupled to the drain of the first transistor $P_5$, and the drain of the second transistor $N_6$. The first transistor $P_5$ is preferably a PMOS transistor. The first transistor $P_5$ has its source coupled to the 3.3V supply voltage, and its gate is coupled to the output of the inverter 304. The second transistor $N_6$ is preferably an NMOS transistor with the gate of the second transistor $N_6$ coupled to the output of the inverter 304, and the source of the second transistor $N_6$ coupled to ground or low.

Still referring to FIG. 4, the pull-up circuit 210 will now be described. The pull-up circuit 210 preferably comprises a first and a second transistors $P_3$, $P_4$. The first and second transistors $P_3$, $P_4$ are preferably PMOS transistors, and each has its well coupled to the 5V supply voltage. Since the input 202 can reach a 5V level by application of a logical 1 of the higher operating voltage to the input 202 of the voltage tolerant latch 200, the present invention advantageously protects the PMOS transistors $P_3$, $P_4$, and $P_1$ directly connected to the input 202 by coupling the well of each of these transistors to the supply voltage for the higher operating voltage, in this case 5V. This prevents any leakage current to the well of these transistors. The first transistor $P_3$ preferably has its source coupled to a 3.3V supply voltage, its gate coupled to the output of the low voltage latch 206, and its drain coupled to the source of the second transistor $P_4$. The second transistor $P_4$ preferably has its source coupled to the drain of the first transistor $P_3$, its gate coupled to the SENS node, and thus to the node voltage controller 208, and its drain coupled to the input 202 of the voltage tolerant latch 200. Thus, when a low signal (0V) and near low signal (3.3V–2*Vtn) are applied to the gates of both the first and second transistors $P_3$, $P_4$ by the output of inverter 304 and the output of the node voltage controller 208, respectively, both transistors $P_3$, $P_4$ turn ON and pull the input 202 up toward 3.3V. Otherwise, at least one of the transistors $P_3$, $P_4$ is off and the pull-up circuit 210 is not activated.

As best shown in FIG. 4, the node voltage controller 208 comprises five transistors $P_2$, $N_1$, $N_2$, $N_3$, $N_4$ and a current source 302. The SENS node forms the first input and output of the node voltage controller 208, the remaining inputs to the node voltage controller 208 being the gates of transistors $P_2$ and $N_4$. The SENS node is coupled to the drain of buffer transistor $P_1$ and the input of the pull-up circuit 210. The current source 302 is coupled between the SENS node and ground. The current source 302 and transistors $P_2$, $N_1$, $N_2$, form a voltage divider. The transistors $N_3$ and $N_4$ are also coupled between the SENS node and ground. The transistors $N_3$ and $N_4$ are connected in series with transistor $N_3$ having its gate coupled to the 3.3V supply and its drain coupled to the SENS node and with transistor $N_4$ having its gate coupled to the output of the low voltage latch 206 and its source coupled to ground. Thus, in response to an high signal (3.3V) on the output of the low voltage latch 206, the transistor $N_4$ is turned ON to pull the SENS node low. The transistor $N_3$ is provided to protect transistor $N_4$ when a high of the higher operating voltage (5V) is present on the SENS line, and is divided over transistors $N_3$ and $N_4$. The other three transistor $P_2$, $N_1$, and $N_2$ are also coupled in series, but between the SENS node and the 3.3V supply voltage. Transistor $N_2$ has its drain coupled to the SENS node, and its source and gate coupled together and to the drain of transistor $N_1$. Transistor $N_1$ has its gate coupled to the 3.3V supply and its source coupled to the drain of transistors $P_2$. Finally, transistor $P_2$ has its source coupled to the 3.3V supply and its gate coupled to the output of the low voltage latch 206. Thus, in response to a low signal on the output of the low voltage latch 206, the transistors $P_2$, $N_3$ and $N_4$ are turned on to pull the SENS node up to a voltage level of the supply voltage minus the drop across transistors $N_1$ and $N_2$ (3.3V–2*Vtn). When the SENS node voltage goes above this level, the transistor $N_2$ acts as a diode and prevents current flow from the SENS node toward transistor $P_2$.

The operation of the embodiment of the voltage tolerant latch 200 shown in FIG. 4 will now be described in terms of the input 202 of the latch 200 transitioning from low to high, since in the mixed voltage situation, this transition may be either a transition from 0V to 3.3V or a transition from 0V to 5V.

The voltage tolerant latch 200 begins in a state where a low signal (0V) has been applied to the input 202 and the inverter 304 is outputting a high (3.3V) on the output of the low voltage latch 206. Since the output of the low voltage latch 206 is basically high, transistors $P_2$ and $P_3$ are OFF and transistor $N_4$ is turned ON to pull the SENS node low, and in turn the input 202 low. Also, the output of the low voltage latch 206 turns ON and $N_6$ pulls the input 202 low through $N_5$. Here $P_5$ is OFF. As the input 202 begins to transition from low to high, it first goes above a Vih (1V level) of the low voltage latch 206. At this point, the inverter 304 trips thus changing the polarity of the output of the low voltage latch 206 to low. This turns transistors $P_2$ and $P_3$ ON and transistor $N_4$ OFF to pull the SENS node to a level near 3.3V. A voltage of 3.3V minus the drop across the transistors $N_1$ and $N_2$ (3.3V–2*Vtn) appears on the SENS node. This will partially turn ON transistor $P_4$ and pull the voltage level of the input 202 up to 3.3V or high of the lower operating voltage. If the input 202 is floating at this time, then it is pulled high by transistor $P_5$ and transistors $P_3$ and $P_4$. Transistor $P_5$ cannot pull the input 202 higher than 3.3V minus the voltage drop across transistor $N_5$ (3.3V–Vtn). Because of this limitation on transistor $P_5$'s ability to pull the input 202 to high or 3.3V, transistors $P_3$ and $P_4$ are provided to pull the input 202 higher to the 3.3V level. Essentially, 1) the low voltage latch 206 outputs a low signal; 2) the node voltage controller 208 turns on; 3) the SENS node is pulled to a lower voltage level (3.3V–2*Vtn); 4) transistor $P_3$ is turned on; and 5) transistor $P_4$ is turned on.

Just before the input 202 reaches 3.3V+Vtp, the maximum voltage difference across transistor $P_4$ is Vtp+2*Vtn which prevents breakdown or damage to transistor $P_4$. This voltage difference is maintained by the presence of the node voltage controller 208 which acts as a voltage divider and ensures that the SENS node increases in voltage to reduce the gate to drain voltage difference across transistor $P_4$. If not for the presence of the node voltage controller 208, the voltage across transistor $P_4$ could reach as high as 3.3V+Vtp which could destroy the device.

As the input 202 reaches 3.3V+Vtp, transistor $P_1$ turns ON and the voltage of SENS node follows the input 202. This turns transistor $N_2$ off, and it acts like a diode to prevent current flow past transistor $N_2$ toward transistor $N_1$. This also turns transistor $P_4$ off and cuts the path between the input 202 and the 3.3V supply through transistors $P_3$ and $P_4$. Thus, when an external source (not shown) applies a 5V signal to the input 202, the low voltage latch 206 is protected by the buffer transistor $N_5$, the pull-up circuit 210 is deactivated, and the components of the node voltage controller 208 are protected from the application of such a high of a higher operating voltage circuit using voltage divider principles.

As the external source applying a 5V signal is removed, and the input 202 begins to float, the current mirror 302 is used to discharge current slowly and pull the voltage level on the SENS node downward from the 5V level. Since the input 202 still remains at a higher voltage level, the output of the inverter 304 is low. Thus transistors $P_3$ and $P_2$ are ON, and $N_4$ is OFF. As the SENS node is drawn to the lower voltage level of 3.3V–2*Vtn, transistor $P_4$ turns on, thereby activating the pull-up circuit 210 and holding the input line 202 at the 3.3V level.

When the input 202 returns to less than 1V, the inverter 304 trips and changes the polarity of the output of the low voltage latch 206 to high (3.3V). This turns transistors $P_2$ and $P_3$ off. Transistor $N_4$ is turned ON to pull the SENS node low, and also turn ON transistor $N_6$ to pull the input 202 to low. This also turns off transistor $P_4$ and the pull-up circuit 210.

Figure 5:
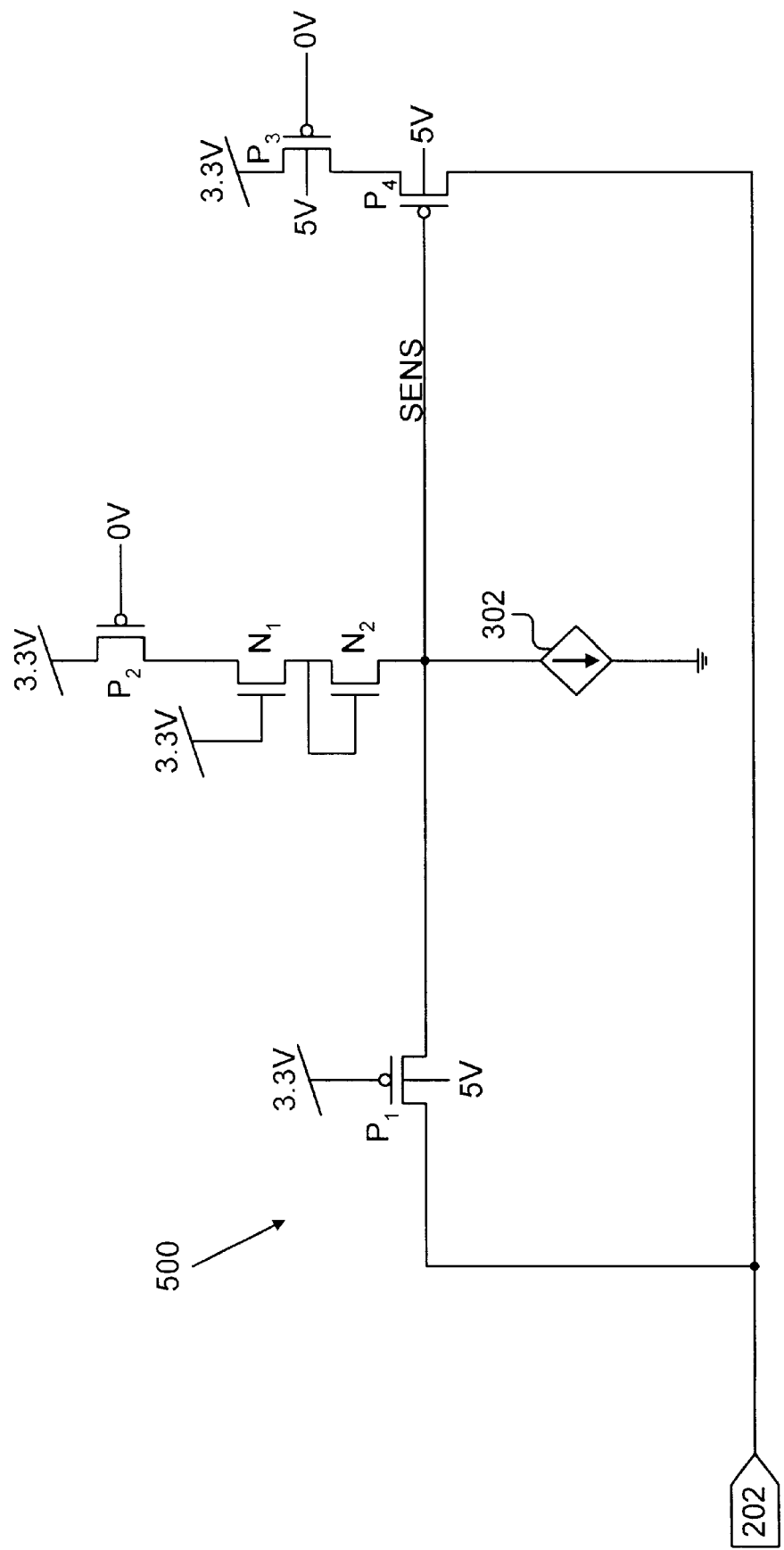
FIG. 5 is a detailed block diagram of a preferred embodiment of the pull-up circuit constructed according to the present invention.

While the present invention has been described with reference to certain preferred embodiments, those skilled in the art will recognize that various modifications may be provided. For example, a pull-up resistor circuit 500, derived from the voltage tolerant bus hold latch 200, is shown in FIG. 5. For convenience and ease of understanding like reference numerals have been used for like parts between the voltage tolerant bus hold latch 200 and the pull-up resistor circuit 500. The pull-up resistor circuit 500 operates with the same principles of the present invention and assists in pulling up node 202 to the high voltage. The pull-up resistor circuit 500 preferably comprises PMOS transistors $P_1$, $P_2$, $P_3$, $P_4$, NMOS transistors $N_1$, $N_2$, and current source 302. The components are coupled and operate in a manner similar to that described above with reference to FIG. 4. Notable differences include the coupling of the gate of transistors $P_2$ and $P_3$ to zero volts. The pull-up resistor circuit 500 is advantageously unaffected by the application of a higher operating voltage to node 202 because each of the transistors $P_1$, $P_3$ and $P_4$ coupled to node 202 have their wells coupled to higher operating voltage to minimize leakage current and any damage to these devices. These and other variations upon, and modifications to the preferred embodiment are provided for by the present invention, which is limited only by the following claims.

What is claimed is:

1. A voltage tolerant latch for receiving input signals from either circuitry operating at a first operating voltage level or circuitry operating at a second operating voltage level, the voltage tolerant latch comprising:

a first latch having an input and an output;

a first buffer transistor coupled before the input to the first latch;

a pull-up circuit for selectively adjusting the voltage level of the input of the first latch in response to a control signal, the pull-up circuit coupled to the input and the output of the first latch; and a node voltage controller having a plurality of inputs and an output for controlling the operation of the pull-up circuit and protecting the first latch from the first and second operating voltages, the node voltage controller coupled to the pull-up circuit to provide the control signal, the node voltage controller having an input coupled to the output of the first latch and an input coupled to the input of the first latch.

2. The voltage tolerant latch of claim 1, wherein the first buffer transistor is an n-type MOSFET.

3. A voltage tolerant latch for receiving input signals from either circuitry operating at a first operating voltage level or circuitry operating at a second operating voltage level, the voltage tolerant latch comprising:

a first latch having an input and an output;

a pull-up circuit for selectively adjusting the voltage level of the input of the first latch in response to a control signal, the pull-up circuit coupled to the input and the output of the first latch;

a node voltage controller having a plurality of inputs and an output for controlling the operation of the pull-up circuit and protecting the first latch from the first and second operating voltages, the node voltage controller coupled to the pull-up circuit to provide the control signal, the node voltage controller having an input coupled to the output of the first latch and an input coupled to the input of the first latch; and a sense transistor coupled between an input to the voltage tolerant latch and the node voltage controller.

4. The voltage tolerant latch of claim 3, wherein the sense transistor is an p-type MOSFET.

5. A voltage tolerant latch for receiving input signals from either circuitry operating at a first operating voltage level or circuitry operating at a second operating voltage level, the voltage tolerant latch comprising:

an inverter having an input and an output;

a first transistor having its gate coupled to the output of the inverter and coupled between a supply voltage and the input of the inverter;

second transistor having its gate coupled to the output of the inverter and coupled between ground and the input of the inverter;

a pull-up circuit for selectively adjusting the voltage level of the input of the inverter in response to a control signal, the pull-up circuit coupled to the input and the output of the inverter; and a node voltage controller having a plurality of inputs and an output for controlling the operation of the pull-up circuit and protecting the inverter from the first and second operating voltages, the node voltage controller coupled to the pull-up circuit to provide the control signal, the node voltage controller having an input coupled to the output of the inverter and an input coupled to the input of the inverter.

6. The voltage tolerant latch of claim 5, wherein the first transistor is an p-type MOSFET, and the second transistor is an n-type MOSFET.

7. A voltage tolerant latch for receiving input signals from either circuitry operating at a first operating voltage level or circuitry operating at a second operating voltage level, the voltage tolerant latch comprising:

a first latch having an input and an output;

a pull-up circuit for selectively adjusting the voltage level of the input of the first latch in response to a control signal, the pull-up circuit coupled to the input and the output of the first latch; said pull-up circuit comprising:

a first transistor having a gate, a source and a drain, the source of the first transistor coupled to a supply voltage, the gate of the first transistor coupled to the output of the first latch; and a second transistor having a gate, a source and a drain, the source of the second transistor coupled to the drain of the first transistor, and the drain of the second transistor coupled to the input of the first latch; and a node voltage controller having a plurality of inputs and an output for controlling the operation of the pull-up circuit and protecting the first latch from the first and second operating voltages, the node voltage controller coupled to the gate of the second transistor to provide a control signal to the pull-up circuit, the node voltage controller having an input coupled to the output of the first latch and an input coupled to the input of the first latch.

8. The voltage tolerant latch of claim 7, wherein the first and second transistors are p-type MOSFETs.

9. The voltage tolerant latch of claim 7, wherein the first transistor has its well coupled to a high voltage level of the second operating voltage.

10. The voltage tolerant latch of claim 7, wherein the second transistor has its well coupled to a high voltage level of the second operating voltage.

11. A voltage tolerant latch for receiving input signals from either circuitry operating at a first operating voltage level or circuitry operating at a second operating voltage level, the voltage tolerant latch comprising:

a first latch having an input and an output;

a pull-up circuit for selectively adjusting the voltage level of the input of the first latch in response to a control signal, the pull-up circuit coupled to the input and the output of the first latch; and a node voltage controller having a plurality of inputs and an output for controlling the operation of the pull-up circuit and protecting the first latch from the first and second operating voltages, the node voltage controller coupled to the pull-up circuit to provide the control signal, the node voltage controller having an input coupled to the output of the first latch and an input coupled to the input of the first latch; and the node voltage controller further comprising:

a first transistor having a gate, a source and a drain, the source of the first transistor coupled to a supply voltage, the gate of the first transistor coupled to the output of the first latch;

a current source coupled to ground and to the drain of the first transistor; and a second transistor having a gate, a source and a drain, the source of the second transistor coupled to the drain of the first transistor, the gate of the second transistor coupled to the output of the first latch, and the drain of the second transistor coupled ground.

12. The voltage tolerant latch of claim 11, wherein the first transistor is a p-type MOSFET, and the second transistor is a n-type MOSFET.

13. The voltage tolerant latch of claim 12, wherein the node voltage controller further comprises a third transistor having a gate, a source and a drain, the source of the third transistor coupled to the drain of the first transistor, the gate of the third transistor coupled to the supply voltage, and the drain of the third transistor coupled to the source of the second transistor.

14. The voltage tolerant latch of claim 11, wherein the node voltage controller further comprises:

a third transistor having a gate, a source and a drain, the source of the third transistor coupled to the drain of the first transistor, the gate of the third transistor coupled to the supply voltage;

a fourth transistor having a gate, a source and a drain, the source and gate of the fourth transistor coupled to the drain of the third transistor, and the drain of the second transistor coupled to the source of the second transistor.

15. A circuit for selectively adjusting a voltage level of an input in response to a first and second control signals, the circuit comprising:

a first transistor having a gate, a source and a drain, the source of the first transistor coupled to a supply voltage, the gate of the first transistor coupled to receive the second control signal; and a second transistor having a gate, a source and a drain, the source of the second transistor coupled to the drain of the first transistor, the gate of the second transistor coupled to receive the first control signal, and the drain of the second transistor coupled to the input.

16. The circuit of claim 15, wherein the first and second transistors are p-type MOSFETs.

17. The circuit of claim 15, further comprising a node voltage controller having a plurality of inputs and an output for controlling the operation of the circuit, the node voltage controller coupled to the circuit to provide the first control signal.

18. The circuit of claim 17, wherein the node voltage controller further comprises:

a third transistor having a gate, a source and a drain, the source of the third transistor coupled to a supply voltage, and the gate of the third transistor coupled to the gate of the first transistor;

a current source coupled to ground and to the drain of the third transistor;

a fourth transistor having a gate, a source and a drain, the source of the fourth transistor coupled to the drain of the third transistor, the gate of the fourth transistor coupled to the gate of the first transistor, and the drain of the fourth transistor coupled ground.

19. The circuit of claim 18, wherein the third transistor is a p-type MOSFET, and the fourth transistor is a n-type MOSFET.

20. The circuit of claim 18, wherein the node voltage controller further comprises a fifth transistor having a gate, a source and a drain, the source of the fifth transistor coupled to the drain of the third transistor, the gate of the fifth transistor coupled to the supply voltage, and the drain of the fifth transistor coupled to the gate of the second transistor.

21. A circuit for selectively adjusting a voltage level of a first input in response to a second node, the circuit comprising:

a first transistor having a gate, a source and a drain, the source of the first transistor coupled to a supply voltage, the gate of the first transistor coupled to the second node; and a second transistor having a gate, a source and a drain, the source of the second transistor coupled to the drain of the first transistor, and the drain of the second transistor coupled to the first input;

a third transistor having a gate, a source and a drain, the source of the third transistor coupled to the supply voltage, the gate of the third transistor coupled to the second node, and the drain of the third transistor coupled to the gate of the second transistor;

a fourth transistor having a gate, a source and a drain, the source of the fourth transistor coupled to ground, the drain of the fourth transistor coupled to the gate of the second transistor, and the gate of the fourth transistor coupled to the second node.

22. The circuit of claim 21, further comprising a fifth transistor having a gate, source and drain, the gate of the fifth transistor coupled to the supply voltage, the source of the fifth transistor coupled to the first input, and the drain of the fifth transistor coupled to the gate of the second transistor.

23. The circuit of claim 22, wherein the first transistor and the fifth transistor have their wells coupled to a high voltage level of the second operating voltage.

24. The circuit of claim 23, further comprising a current source coupled to ground and to the gate of the second transistor.

25. The circuit of claim 21, further comprising a buffer transistor that couples the gate of the second transistor to the drain of the fourth transistor.

26. The circuit of claim 21, further comprising a pair of buffer transistors coupled in series that couple the drain of the third transistor and the gate of the second transistor.

27. The circuit of claim 21, wherein the first, second and third transistors are p-type MOSFETs, and the fourth transistor is a n-type MOSFET.

28. A circuit for pulling up a node to a high voltage level, the circuit comprising:

a first transistor having a gate, a source and a drain, the source of the first transistor coupled to a supply voltage, the gate of the first transistor coupled to zero volts; and a second transistor having a gate, a source and a drain, the source of the second transistor coupled to the drain of the first transistor, and the drain of the second transistor coupled to the node; and a third transistor having a gate, a source and a drain, the source of the third transistor coupled to the gate of the second transistor, the gate of the third transistor coupled a supply voltage, and the drain of the third transistor coupled to the node.

29. The circuit of claim 28, wherein the first, second and third transistors are p-type MOSFETs.

30. The circuit of claim 28, wherein the circuit further comprises a current source coupled to ground and the gate of the second transistor.

31. The circuit of claim 28, wherein the circuit further comprises:

a fourth transistor having a gate, a source and a drain, the source of the fourth transistor coupled to a supply voltage, the gate of the fourth transistor coupled to the zero volts;

a fifth transistor having a gate, a source and a drain, the source of the fifth transistor coupled to the drain of the fourth transistor, and the gate of the fifth transistor coupled to the supply voltage; and a sixth transistor having a gate, a source and a drain, the source of the sixth transistor coupled to the gate of the sixth transistor and to the drain of the fifth transistor, and the drain of the sixth transistor coupled to the gate of the second transistor.

32. The circuit of claim 28, wherein the first, second and third transistors each have their well coupled to a high voltage level of a second operating voltage.

* * * * *